(12) United States Patent
Fox

(10) Patent No.: US 7,139,963 B1
(45) Date of Patent: Nov. 21, 2006

(54) METHODS AND APPARATUS TO SUPPORT ERROR-CHECKING OF VARIABLE LENGTH DATA PACKETS USING A MULTI-STAGE PROCESS

(75) Inventor: David B. Fox, Bolton, MA (US)

(73) Assignee: Cisco Technology, Inc., San Jose, CA (US)

( * ) Notice: Subject to any disclaimer, the term of this patent is extended or adjusted under 35 U.S.C. 154(b) by 412 days.

(21) Appl. No.: 10/439,059

(22) Filed: May 15, 2003

(51) Int. Cl.
*H03M 13/00* (2006.01)
(52) U.S. Cl. .................................. 714/758; 714/758
(58) Field of Classification Search .............. 714/763, 714/776, 786, 777, 758; 370/390
See application file for complete search history.

(56) References Cited

U.S. PATENT DOCUMENTS

| | | | | |
|---|---|---|---|---|
| 5,870,412 A * | 2/1999 | Schuster et al. | ............ | 714/752 |
| 5,878,059 A * | 3/1999 | Maclellan | ................... | 714/768 |
| 5,886,930 A * | 3/1999 | Maclellan et al. | ..... | 365/189.05 |
| 6,101,520 A * | 8/2000 | Lan et al. | .................. | 708/492 |
| 6,125,467 A * | 9/2000 | Dixon | ......................... | 714/763 |
| 6,357,032 B1 | 3/2002 | Plotz et al. | ................. | 714/758 |
| 6,675,344 B1 * | 1/2004 | Sharma | ...................... | 714/763 |
| 6,681,364 B1 * | 1/2004 | Calvignac et al. | ......... | 714/776 |
| 6,721,316 B1 | 4/2004 | Epps et al. | ................. | 370/389 |
| 6,731,644 B1 | 5/2004 | Epps et al. | ................. | 370/412 |
| 6,731,646 B1 | 5/2004 | Banks et al. | ................ | 370/422 |
| 2001/0025361 A1* | 9/2001 | Kim | ........................... | 714/786 |
| 2003/0067916 A1* | 4/2003 | Deml et al. | ................. | 370/390 |
| 2003/0233609 A1* | 12/2003 | Ikonomopoulos et al. | .. | 714/758 |
| 2004/0158793 A1* | 8/2004 | Blightman | .................. | 714/758 |

\* cited by examiner

*Primary Examiner*—Guy Lamarre
*Assistant Examiner*—Sam Rizk
(74) *Attorney, Agent, or Firm*—BainwoodHuang

(57) ABSTRACT

A given data packet is parsed into words and a final partial word that are processed (depending on size) in each of multiple successive stages of logic circuitry. Similarly sized words are processed at one stage of the logic circuit. Smaller and smaller modulo-2 components of the final partial word are processed at successive stages of logic circuitry. Based on this technique of processing modulo-2 components in different stages, the corresponding multi-stage logic circuit can be implemented in a low cost logic circuit such as an FPGA device instead of a custom-masked ASIC.

28 Claims, 5 Drawing Sheets

METHODS AND APPARATUS TO SUPPORT ERROR-CHECKING OF VARIABLE LENGTH DATA PACKETS USING A MULTI-STAGE PROCESS

BACKGROUND OF THE INVENTION

In general, CRC (Cyclical Redundancy Check) error-checking involves detecting errors during transmission of data packets. Prior to sending a data packet, a transmitter typically processes the data packet using a complex calculation (based on a polynomial equation) to generate a CRC value. Upon sending the data packet, the transmitter also sends the CRC value along with the data packet for error-checking purposes. A receiver of the data packet and corresponding CRC value typically repeats the same complex error-checking calculation on the data packet. If the receiver generates the same CRC value for the data packet as the CRC value received along with the data packet, it is assumed that the data packet transmission was received error-free.

In one application, each data packet transmitted in a communication system is guaranteed to be a multiple of some word length by padding the packet. In this case, it is a relatively straightforward process to generate corresponding CRC values because data packets are partitioned into equally-sized words for parallel processing. Restricting data packets to a multiple of some word size solely for CRC error-checking purposes adds extra padding overhead. Thus, in many applications, parallel error-checking circuits must be able to generate CRC values for data packets that are not a multiple of some word size. Error-checking circuits that process variably sized data packets are typically more complex because the error-checking circuitry must account for partial data words at the end of the packet.

According to one conventional parallel method, CRC error-checking involves the use of a two-part circuit. A first part of the circuit processes equally sized words of the data packet in parallel to generate successive, residual CRC values. In general, design and development of the first part of the CRC error-checking circuit is reasonably straightforward because the first part of the error-checking circuit processes only the equally sized full words of the data packet. If the last word of the data is a partial word, it is padded out to a full word using 1's or 0's. The second portion of the circuit will remove the effect of the padding applied to the final word.

SUMMARY

Unfortunately, there are deficiencies associated with conventional parallel techniques of generating CRC values for data packets that vary in size. For example, the second part of the above-mentioned conventional error-checking circuit is typically quite complex because the circuit must take into account a variable amount of padding associated with the last word of the data packet.

The first part of the above-mentioned conventional circuit is fairly straightforward and thus employs multiple levels (such as 8 levels) of combinational logic to generate residual CRC values associated with a data packet. The second part of the circuit is typically more complex and requires much deeper (such as 30) levels of combinational logic because it must compensate for different amounts of padding depending on a size of the data packet being processed.

In practice, each level of a combinational logic circuit (such as an XOR logic tree) has an associated delay time for generating a corresponding output. Consequently, conventional circuits employing complex combinational logic (many levels of logic) inherently introduce more delay and therefore run at lower frequencies. In addition to signal propagation gate delays, increased wire loading in complex combinational logic circuits also affects the internal circuit delays.

One method of overcoming the additional delays introduced by the above-mentioned conventional circuit is to employ faster technology such as custom-masked ASIC (Application Specific Integrated Circuit) devices. Unfortunately, this is a costly solution if such an ASIC device is not manufactured in high volumes. In addition to high cost, custom-masked ASICs cannot be modified or reprogrammed like slower and more affordable FPGA (Field Programmable Gate Array) devices. Mistakes precipitating changes (such as the polynomial for error-checking) in logic of the custom-masked ASIC device are costly because they require a custom re-masking of the ASIC chip. Due to complexity, it is often difficult or even impossible to implement these circuits in slow devices such as FPGAs (Field Programmable Gate Arrays).

It is an advancement in the art to provide a multi-stage logic circuit that processes successive words of a given data packet in different stages to produce a resulting CRC value. As a result of reduced complexity, such a circuit typically can be implemented in slower, and lower-cost circuit packages.

One aspect of the present invention involves supporting error-checking in data packets of any size. A multi-stage logic circuit parses a given data packet into modulo-2 sized words for processing (depending on size) in each of multiple stages of logic circuitry. The multi-stage logic circuit processes similarly sized portions of the given data packet at corresponding stages of the multi-stage logic circuit. For example, an 8-byte wide CRC generator/checker would implement 8-byte, 4-byte, 2-byte, and 1-byte processing stages. Based on this technique of processing smaller portions in different stages, the corresponding multi-stage logic circuit can be implemented in a low cost and potentially lower speed logic device such as an FPGA device instead of a custom-masked ASIC device.

The multi-stage logic circuit includes a memory device to temporarily store successive words of the given data packet at each stage of the multi-stage logic circuit. A detection circuit associated with each stage determines whether or not to by-pass the stage based on the size of the partial word.

The technique of breaking up the final partial word into its binary components reduces overall complexity of the logic circuit generating a CRC value. For example, each stage of the multi-stage logic circuit processes a single modulo-2 component of the final partial word. Because each stage processes a fixed-size modulo-2 component, complexity of the logic circuit associated with each stage is reduced. This reduction in complexity enables the multi-stage logic circuit to maintain its performance with fewer levels of required logic circuit and thus better timing characteristics.

As discussed, the detection circuit identifies a modulo-2 size of the last partial word of the given data packet to be processed. The size bits associated with the final partial word of the given data packet are maintained so that the multi-stage logic circuit knows at which stage to process an associated modulo-2 component of the partial word. Thus, as the final partial word passes through the multi-stage logic circuit, each stage identifies how and whether to process a particular modulo-2 component of the partial word based on size bits (e.g., bits that identify the number of bytes in the last word of each data packet). Each successive stage of the multi-stage logic circuit generates a residual CRC value to finally produce an overall CRC error-checking value for the given data packet.

In one application, a barrel shifter is implemented so that contents of the modulo-2 components of the word to be processed at each successive stage are shifted such that they are always stored in the same portion of the register. Barrel-shifting portions of the given data packet at each stage separates the required multiplexing of the words from the CRC generator/checker logic, thus reducing the depth of the logic and the amount of loading on the register outputs. As a result of reduced trace lengths, processing time (and more specifically signal propagation delay times) associated with generating residual CRC values at stages of the multi-stage logic circuit is reduced.

According to another arrangement, the multi-stage logic circuit simultaneously processes words of two different data packets at the same time. For example, the multi-stage logic circuit simultaneously processes a word of the given data packet at one stage of the logic circuitry and a word of another data packet at another stage of the logic circuitry. This efficient use of the multi-stage logic circuit increases a speed of generating CRC values associated with data packets.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily drawn to scale, emphasis instead being placed upon illustrating the principles of the present invention.

DETAILED DESCRIPTION

Networking devices such as routers almost always implement error-checking techniques to ensure the integrity of transmitted data packets. As a result of ever-increasing demand for bandwidth (e.g., Internet access), routers and other data communication devices must perform error-checking at much higher data rates. To keep up with increased demand, logic circuitry for error-checking data packets must be fast enough to keep up with a pace of receiving data packets. Otherwise, error-checking will cause an unwanted bottleneck.

As discussed, one aspect of the present invention involves supporting error-checking of variably sized data packets. Initially, a first stage of a multi-stage logic circuit processes and generates residual CRC values associated with equally sized words of a given data packet. A last partial word of the given data packet is parsed into successively smaller module-2 components that are processed (depending on size) in each of multiple following stages of the multi-stage logic circuit. This technique of processing smaller module-2 components of the given data packet in different stages of the multi-stage logic circuit reduces the corresponding complexity of the multi-stage logic circuit.

Although the techniques described herein are suitable for use in networking applications, and particularly to applications requiring detection of errors associated with data packets transmitted over a network, the techniques are also well-suited for other applications that employ error-checking of data packets that vary in length.

Figure 1:
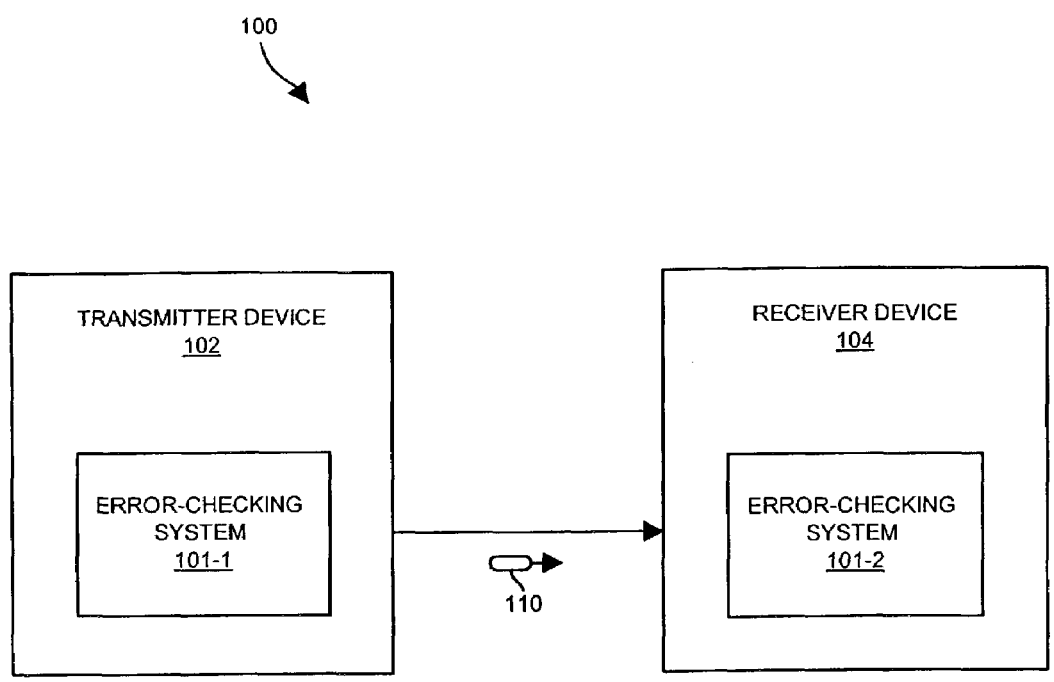
FIG. 1 is a block diagram of a communication network for transmitting and receiving data packets.

FIG. 1 is block diagram of communication system 100 for transmitting and receiving data packets 110. As shown, communication system 100 includes transmitter 102 and receiver 104 for respectively transmitting and receiving data packets 110 In the context of a network, transmitter device 102 and receiver device 104 are network nodes in which data packets 110 are transmitted according to a given layer-2 protocol.

Prior to transmitting data packet 110 from transmitter device 102, at least a portion or all of its data payload is processed via error-checking system 101-1 to produce, for example, a CRC value for data packet 110 or portion thereof. Error-checking system 101-1 utilizes internally generated size bits to process successive portions of each data packet 110 at different stages. This is discussed in more detail later in the specification. Transmitter 102 transmits data packet 110 including its corresponding CRC value to receiver 104.

Upon receipt of data packet 110 and CRC value at receiver device 104, error-checking system 101-2 verifies that data packet 110 is free from errors. Similar to error-checking system 101-1, error-checking system 101-2 utilizes internally generates size bits to process successive portions of each data packet 110 at different stages. Following FIG. 2 more specifically illustrates a technique of error-checking data packets 110 according to the principles of the present invention.

Figure 2:
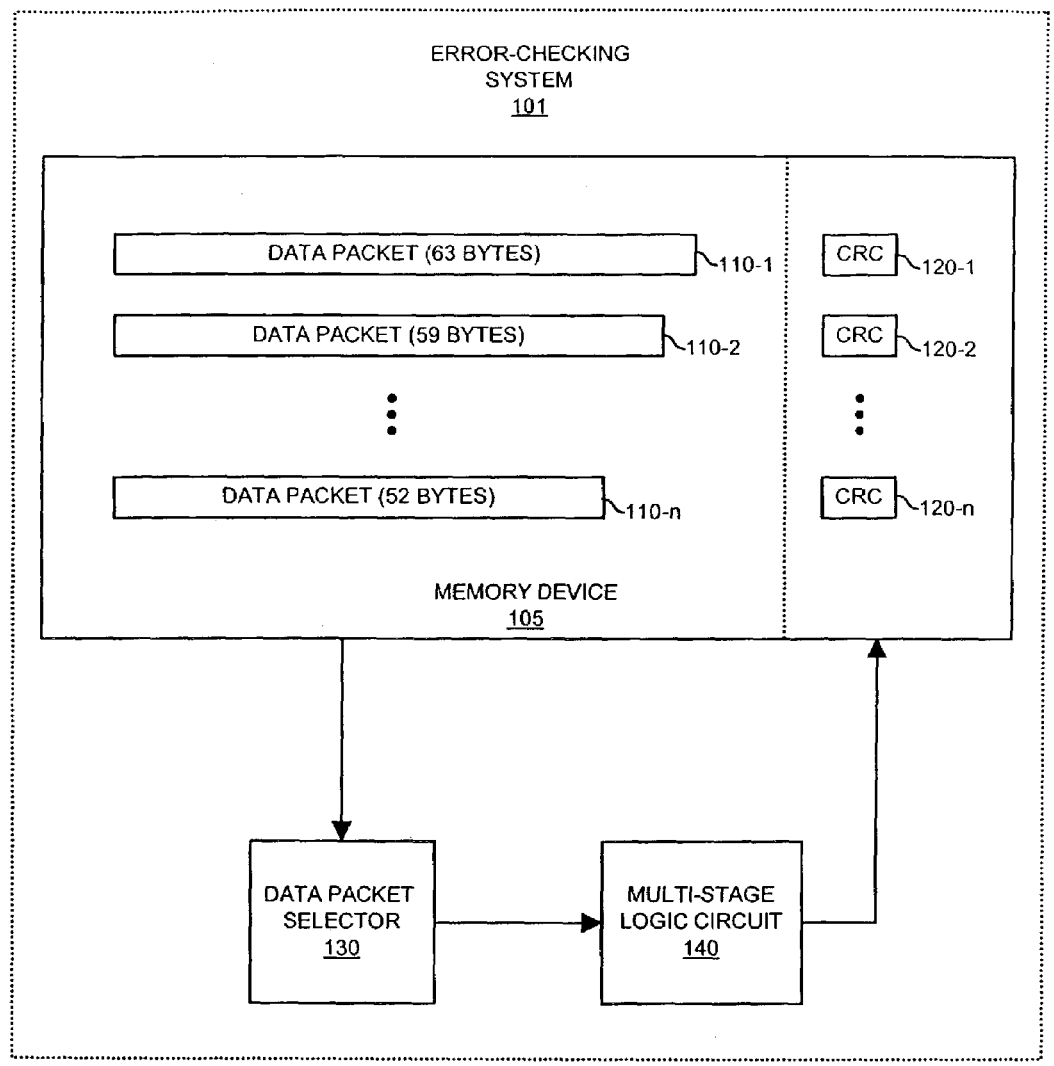
FIG. 2 is a block diagram of a system for error-checking data packets transmitted over a communication network.

FIG. 2 is block diagram of error-checking system 101 for generating CRC values 120 associated with data packets 110. As shown, error-checking system 100 includes memory device 105, data packet selector 130, and multi-stage logic circuit 140.

By way of example as in FIG. 2 and in conjunction with communication system 100 as discussed in FIG. 1, transmitter device 102 such as a router includes error-checking system 101-1 to generate CRC values 120 (such as a byte-wide value) associated with data packets 110. As mentioned, CRC values 120 are transmitted along with the data packets 110 from transmitter device 102 to receiver device 104.

Upon receipt of data packets 110 at receiver device 104, error-checking system 101-2 checks for errors associated with received data packets 110. If generation of a CRC value 110 for a given data packet 110 received at receiver device 104 is the same as the CRC value 120 received along with the corresponding data packet 110, it is assumed that such a data packet 110 was received error-free.

The process of generating CRC value 120 for a data packet 110 involves selecting a data packet 110 stored in memory device 105 such as a FIFO (First In First Out) storage device. For example, data packet selector 130 selects one of multiple data packets 10 of varying length stored in memory device 105. Data packet selector 130 then forwards a selected data packet 110 to multi-stage logic circuit 140 which, in turn, generates a corresponding CRC value 120 that is stored in memory device 105. In one application, the generated CRC value 120 is 4 bytes wide.

Prior to the transmission of data packet 110-1 from transmitter device 102, multi-stage logic circuit 140 includes corresponding CRC value 120-1 in an appropriate field of data packet 110-1. Upon receipt of data packet 110-1 and corresponding CRC value 120-1 at receiver device 104, error-checking system 101-2 verifies that received data packet 110-1 (or error-checked payload) generates the same CRC value 120-1 as that received along with the corresponding data packet 110-1. In this way, error-checking system 101-1 and 101-2 respectively generate and verify CRC values 120 associated with data packets 110 at transmitter device 102 and receiver device 104.

Figure 3:
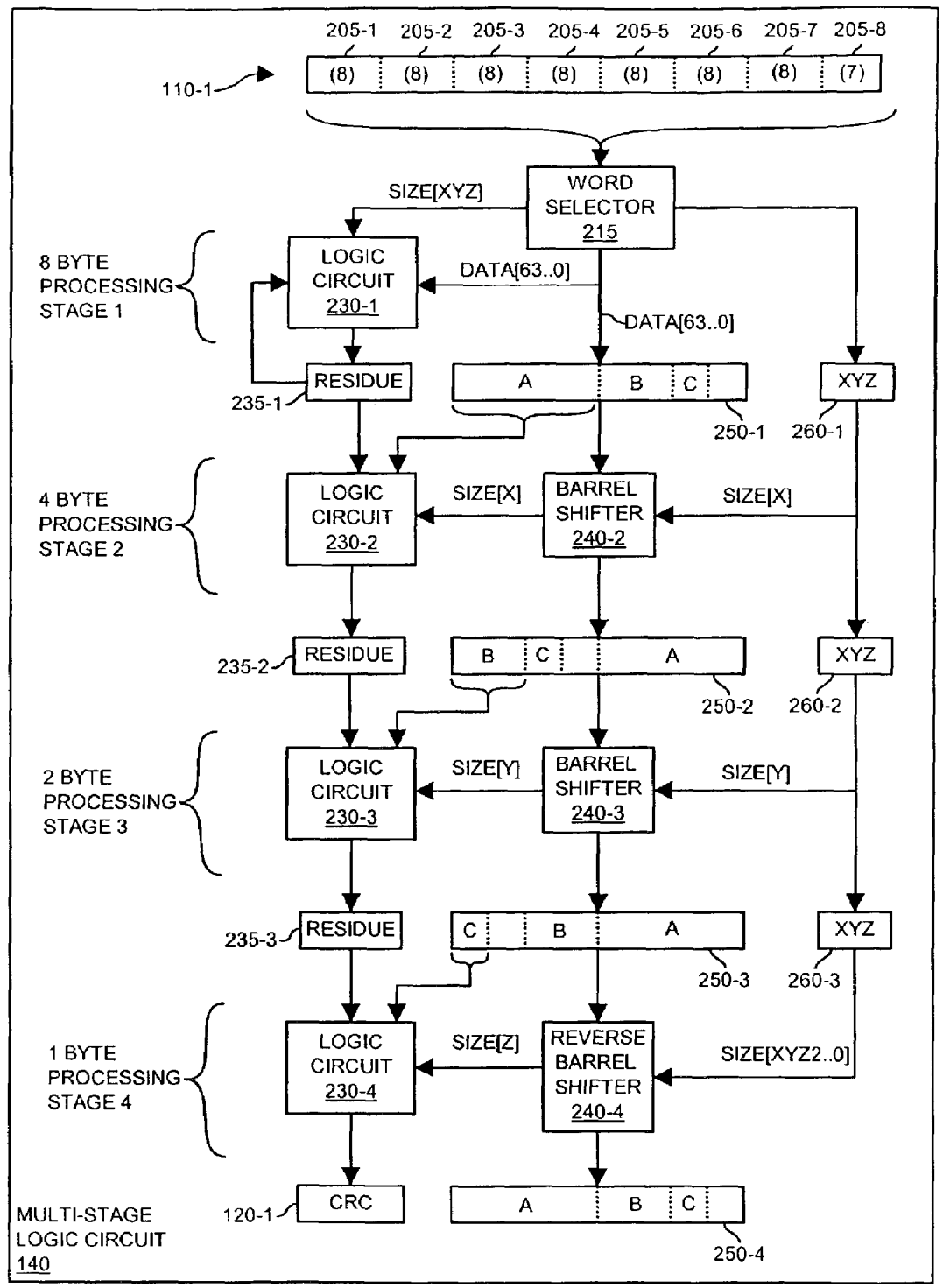
FIG. 3 is a detailed block diagram of a multi-stage logic circuit that generates CRC values associated with data packets of varying size.

FIG. 3 is block diagram more specifically illustrating details of multi-stage logic circuit 140 for generating CRC values 120 associated with data packets 110. As shown, multi-stage logic circuit 140 includes selected data packet 110-1 to be processed, partial word selector 215, and multiple stages of circuitry (e.g., stage 1, stage 2, stage 3, and stage 4) for processing different sized partial words of data packet 110. Stage 1 supports 8-byte processing and includes logic circuit 230-1 and residual CRC value 235-1 (8 bytes). Stage 2 supports 4-byte processing and includes logic circuit 230-2, barrel-shifter 240-2, residual CRC value 235-2 (4 bytes), register 250-1, and size register 260-1. Stage 3 supports 2-byte processing and includes logic circuit 230-3, barrel-shifter 240-3, residual CRC value 235-3 (2 bytes), register 250-2, and size register 260-2. Lastly, stage 4 supports 1-byte processing and includes logic circuit 230-4, reverse barrel-shifter 240-4, final CRC value 120-1 (1 byte), register 250-3 and register 250-4. Of course, multi-stage logic circuit 140 can be expanded to include any number of stages.

As discussed, one aspect of the present invention involves supporting error-checking in data packets 110 of any size. Because data packets 110 vary in size, not every data packet 110 can be divided into equally sized words for parallel processing by a single-stage processing circuit. For example, note that data packet 110-1 is 63 bytes wide. Thus, according to a conventional method, data packet 110-1 could be processed a single byte at a time to generate an associated CRC value 120-1. However, processing data packet 110-1 a single byte at a time requires substantial time to produce a corresponding CRC value 120-1. According to the principles of the present invention, at least a portion of multi-stage logic circuit 140 processes multiple bytes in parallel to produce corresponding CRC value 120-1.

In general, each logic circuit 230 at a corresponding stage of multi-stage logic circuit 140 includes a network of combinational logic such as an XOR tree to produce residual or partial CRC values 235. A specific implementation of logic circuit 230 depends on the corresponding polynomial that is selected for error-checking. In one application, execution of a C++ source code generates a Verilog file based on the selected polynomial. The Verilog file in turn identifies (or programs) hard-coded logic circuit 230 for processing words 205 of data packet 110.

It should be noted that functionality of multi-stage logic circuit 140 is optionally provided via a microprocessor device executing a corresponding set of software instructions in lieu of hard-coded combinational logic circuits 230.

In general, multi-stage logic circuit 140 processes multiple bytes in parallel and generates residual CRC value 235-1 for equally sized words (such as first word 205-1, second word 205-2, . . . , and seventh word 205-7) of data packet 110-1.

For first word 205-1 (8 bytes) of data packet 110-1 selected by word selector 215, logic circuit 230-1 generates residual CRC value 235-1 such as an 8 byte result that is stored in a register. In addition to supplying logic circuit 230-1 with first word 205-1 of data packet 110-1, word selector 215 also provides size bits XYZ=000 to logic circuit 230-1 indicating that the first word 205-1 for processing is 8 bytes wide. Note that size bits XYZ are set to a value depending on a size of a corresponding word 205 of data packet 110 to be processed. For example, size bits XYZ is set to 111 binary for a seven byte partial word 205, XYZ=110 binary for a six byte partial word 205, XYZ=101 binary for a five byte partial word 205, XYZ=100 binary for a four byte partial word 205, XYZ=011 binary for a three byte partial word 205, XYZ=010 binary for a two byte partial word 205, and XYZ=001 binary for a one byte partial word 205. In one application, size bits XYZ are generated by circuitry that buffers data packets 110 for processing.

After processing first word 205-1 of data packet 110-1 as discussed above, word selector 215 selects second word 205-2 of data packet 110-1 for processing. Second word 205-2, corresponding size bits XYZ=000 and residual CRC value 235-1 are fed into logic circuit 230-1 to produce a next residual CRC value 235-1 associated with both second word 205-2 and previously processed first word 205-1 of data packet 110-1. Note that CRC value 235-1 is fed back into logic circuit 230-1 to produce each successive CRC value 235-1. This process is repeated for third word 205-3, fourth word 205-4, fifth word 205-5, sixth word 205-6, and seventh word 205-7 of data packet 110-1 until word selector 215 detects that a remaining partial word (such as eighth partial word 205-8) of data packet 110-1 is smaller than 8 bytes wide.

In the present example, eighth partial word (or final partial word) 205-8 of data packet 110-1 is 7 bytes wide. Accordingly, eighth partial word 205-8 of data packet 110-1 is not processed at stage 1. Instead, word selector 215 stores eighth partial word 205-8 of data packet 110-1 in register 250-1 for future processing of modulo-2 components A, B, and C at respective stages 2, 3, and 4 of multi-stage logic circuit 140.

Word selector 215 generates size bits XYZ (X, Y and Z are each a single bit value such as a logic one or zero) depending on a size of the remaining word of unprocessed bytes of data packet 110-1. Size bit X=1 indicates that there is a 4 byte modulo-2 component of a final partial word of data packet 110-1 to be processed. Conversely, size bit X=0 indicates there is not a 4 byte modulo-2 component of data packet 110 for processing. In a similar way, size bits Y and Z respectively indicate whether there are 2 byte and 1 byte modulo-2 components for processing. Size bits XYZ are stored in corresponding size register 260 at each stage of multi-stage logic circuit 140 for identifying how to process eighth partial word 205-8 of data packet 110-1.

Based on a setting of size bits XYZ, multi-stage logic circuit 140 identifies at what stage to process corresponding modulo-2 components of the last partial word of data packet 110-1. For example, a setting of size bit X=1 indicates that stage 2 of multi-stage logic circuit 140 processes 4-byte modulo-2 component A of eighth partial word 205-8 of data packet 110-1, a setting of size bit Y=1 indicates that stage 3 of multi-stage logic circuit 140 processes 2-byte modulo-2 component B of eighth partial word 205-8 of data packet 110-1, a setting of size bit Z=1 indicates that stage 4 of multi-stage logic circuit 140 processes 1-byte modulo-2 component C of eighth partial word 205-8 of data packet 110-1.

In the present example, eighth partial word 205-8 includes modulo-2 component A (4 bytes), modulo-2 component B (2 bytes), and modulo-2 component C (1 byte) totaling 7 bytes.

Since 7 bytes in eighth partial word 205-8 of data packet 110-1 are yet unprocessed by multi-stage logic circuit 140, word selector 215 generates size bits XYZ=111 for storage in size register 260-1. As mentioned, size bits XYZ are passed from stage to stage identifying at which stage modulo-2 components of eighth partial word 205-8 of data packet 110-1 shall be processed. For example, X=1 indicates that a modulo-2 component of eighth partial word 205-8 of data packet 110-1 will be processed at stage 2 of multi-stage logic circuit 140.

As previously discussed, stage 1 processes the first 7 equally-sized words 205 of data packet 110-1 that are 8 bytes wide. Since size bit X=1 for eighth partial word 205-8, stage 2 processes the next four bytes (labeled modulo-2 component A) of data packet 110-1 stored in register 250-1. The most significant size bit (X) of size bits XYZ stored in size register 260-1 indicates that there are 4 bytes for processing in stage 2 of multi-stage logic circuit 140.

Stage 2 processing involves feeding residual CRC value 235-1 (8 bytes) and modulo-2 component A (4 bytes of eighth partial word 205-8) in register 250-1 to logic circuit 230-2 which, in turn, produces a corresponding residual CRC value 235-2 such as 4 bytes. Up to this point, CRC value 235-2 captures a residual CRC value associated with first the first 56 bytes (first word 205-1, second word 205-2, third word 205-3, fourth word 205-4, fifth word 205-5, sixth word 205-6, seventh word 205-7, and modulo-2 component A) of data packet 110-1.

At or about the same time of generating residual CRC value 235-2 at stage 2, barrel shifter 240-2 determines whether to pass data stored in register 250-1 unshifted or barrel shifted to register 250-2. As discussed, size bit X stored in size register 260-1 indicate that there is a 4 byte modulo-2 component (such as modulo-2 component A) associated with data packet 110-1 for processing. Since bit X=1, barrel-shifter 240-2 swaps modulo-2 component A with 4-byte component B and C as eighth partial word 205-8 of data packet 110-1 in data register 250-2 is transferred to register 250-2.

Barrel-shifting (via barrel-shifter 240) from one stage to the next ensures that modulo-2 components of data packet 110-1 processed at each successive stage of multi-stage circuit 140 are stored in the same location in register 250, such that logic circuit 230 need not implement a multiplexing stage to select the proper portion of the word. For example, note that modulo-2 component B to be processed in stage 3 (as a result of barrel-shifting) is placed into the leftmost 2 bytes of register 250-2. The logic circuit 230-3 therefore only ever needs to perform its calculation on these two leftmost bytes. This technique of barrel-shifting at each stage reduces the length of traces between register 250 storing modulo-2 components of data packet 110-1 to be processed and the logic circuit 230 that produces a residual error-checking result and eliminates the need to simultaneously multiplex the data. As a result of reduced trace lengths and removal of multiplexing, processing time (and more specifically delay times) associated with generating residual CRC values 235 at stages of the multi-stage logic circuit 140 is reduced. Overall CRC values 120-1 thus can be generated more quickly.

In addition to transferring (via barrel-shifting) eighth partial word 205-8 of data packet 110-1 from one stage to the next, size bits XYZ in size register 260-1 are also shifted from one stage to the next. For example, size bits XYZ in register 260-1 are transferred to register 260-2 when the contents of register 250-1 are transferred (via barrel-shifting) to register 250-2. In this way, size bits XYZ are transferred from stage to stage along with yet unprocessed modulo-2 components (e.g., B and C) of data packet 110-1. As discussed, stages of multi-stage logic circuit 140 utilize size bits XYZ to barrel shift data and whether to process CRC values 235 at successive stages of logic circuits 230.

In the event that eighth partial word 205-8 of data packet 205-1 did not include modulo-2 component A for processing (but did include modulo-2 components B and C totaling 3 bytes for processing), size bits XYZ would be set to 011 and modulo-2 component B and C would be passed to stage 2 without being barrel-shifted because in this case size bit X=0. No modulo-2 component would be processed at stage 2 of multi-stage logic circuit 140.

Referring again to the present example where eighth portion 205-8 of data packet 110-1 is 7 bytes including modulo-2 components A, B and C, stage 3 processes the next two bytes (labeled modulo-2 component B) of data packet 110-1 stored in register 250-2. Size bit Y stored in size register 260-2 indicates that there are 2 bytes for processing. For example, Y=1 indicates that modulo-2 component B of data packet 110-1 is next up for processing in stage 3.

Stage 3 processing involves feeding residual CRC value 235-2 (4 bytes) and modulo-2 component B (next 2 bytes of eighth portion 205-8) in register 250-2 to logic circuit 230-3 which, in turn, produces a corresponding residual CRC value 235-3.

At or about the same time of generating residual CRC value 235-3, barrel shifter 240-3 determines whether to pass data stored in register 250-2 unshifted or barrel-shifted to register 250-3 based on size bit Y stored in size register 260-2. Since size bit Y=1, barrel-shifter 240-2 swaps modulo-2 component B stored in register 250-2 with modulo-2 component C as it is transferred to register 250-3. As mentioned, this technique of barrel-shifting ensures that modulo-2 components (e.g., A, B, C) of data packet 110-1 processed at each successive stage of multi-stage circuit 140 are stored in the same portion of register 250 which feed the corresponding portion of logic circuitry 230 that processes modulo-2 components (e.g., A, B, C) of the given data packet 110-1. Barrel-shifting at stage 3 is beneficial for similar reasons as discussed above. In addition to transferring modulo-2 components A, B and C from register 250-2 to register 250-3, size bits XYZ in size register 260-2 are transferred to size register 260-3. As mentioned, size bits XYZ are transferred from stage to stage along with the yet unprocessed modulo-2 component C of partial word 205-8.

Stage 4 processes the final one byte (labeled modulo-2 component C) of partial word 205-8 stored in register 250-3. The least significant size bit (Z) of size bits XYZ stored in size register 260-3 indicates that there is 1 byte left for processing. For example, Z=1 indicates that modulo-2 component C of data packet 110-1 will be processed next in stage 4.

Stage 4 processing involves feeding residual CRC value 235-3 (2 bytes) and modulo-2 component C (last byte of eighth partial word 205-8) in register 250-3 to logic circuit 230-4 which, in turn, produces a corresponding final CRC value 120-1.

At or about the same time of generating final CRC value 120-1, reverse barrel shifter 240-4 shifts modulo-2 components A, B and C back to their original order for storage in register 250-4 as the bits were prior to processing as shown in register 250-1. Size bits XYZ in size register 260-3 are used identify how to re-order partial word 205-8 into its original format. For example, size bits XYZ indicate how modulo-2 components of data packet 110 were barrel-shifted at each successive stage and, thus, how to reverse barrel-shift eighth partial word 205-8 in register 250-3 so that modulo-2 components A, B, and C are reordered back to their original order before processing.

This technique of processing words and successive modulo-2 components of the final partial word at different stages of multi-stage logic circuit 140 reduces its overall complexity. For example, each stage of multi-stage logic circuit 140 processes a known modulo-2 component (i.e., stage 1 processes 8-byte modulo-2 components, stage 2 processes 4-byte modulo-2 components, stage 3 processes 2-byte modulo-2 components, stage 4 processes 1-byte modulo-2 components). Because each modulo-2 component of the final partial word to be processed is of known size, complexity of logic circuit 230 associated with each stage is reduced. Consequently, levels of logic as well as wire-loading effects can be minimized.

As a result of reduced complexity of logic circuit 230 at each stage, multi-stage logic circuit 140 can generate a CRC value 120 at a higher frequency. This is especially useful in applications requiring high data packet 110-1 throughput such as routers.

A consequence of reduced complexity to process and barrel-shifting modulo-2 components A, B, and C at successive stages of multi-stage logic circuit 140 is increased packaging flexibility. For example, all or part of multi-stage logic circuit 140 can be implemented in a smaller, low cost and potentially slower speed logic device such as an FPGA device instead of a custom-masked ASIC device.

It should be noted that multi-stage logic circuit 140 is well-suited for processing back-to-back data packets 110 to generate two corresponding CRC values 120. For example, an eighth partial word 205-8 of data packet 110-1 can be processed at successive stages 2, 3 and 4 while 8-byte words of data packet 110-2 are simultaneously processed at stage 1, 2, and 3. This technique of simultaneously processing words 205 of different data packets 110 enables multi-stage logic circuit 140 to eliminate any gap between packets.

Figure 4:
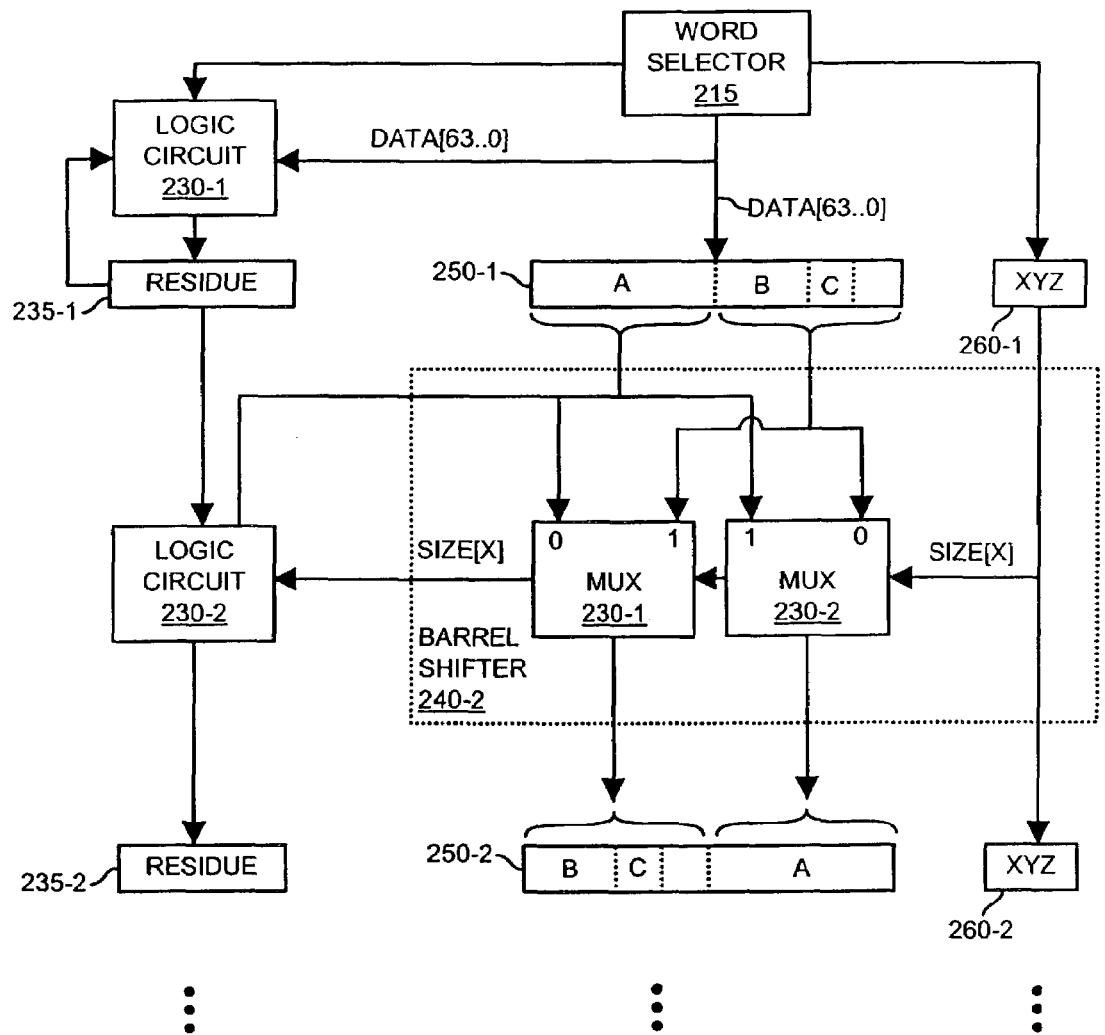
FIG. 4 is a block diagram of part of the multi-stage logic circuit and details of a barrel-shifter circuit.

FIG. 4 is a more detailed block diagram of a technique for barrel-shifting modulo-2 components A, B and C of eighth partial word 205-8 of data packet 110-1. As shown, multiplexer 230-1 and multiplexer 230-2 utilize size bit X stored in size register 260-1 as control or address signals to barrel-shift modulo-2 component A with modulo-2 components B and C from stage to stage. In the above example, size bit X stored in register 260-1 is a logic 1 (indicating that modulo-2 component A was processed at stage 2). Accordingly, barrel-shifter 240-2 re-orders modulo-2 components A, B and C of data packet 110-1 when it is shifted to register 250-2.

Conversely, when size bit X stored in register 260-1 is a logic 0 (indicating that there was no modulo-2 component A of data packet 110-1 to process at stage 2), barrel-shifter 240-2 transfers contents of register 250-1 to register 250-2 without re-ordering. Multi-stage logic circuit 140 optionally employs similar barrel-shifting techniques at successive stages 3, 4 and so on. Barrel-shifting in this way is beneficial for similar reasons as discussed above.

Figure 5:
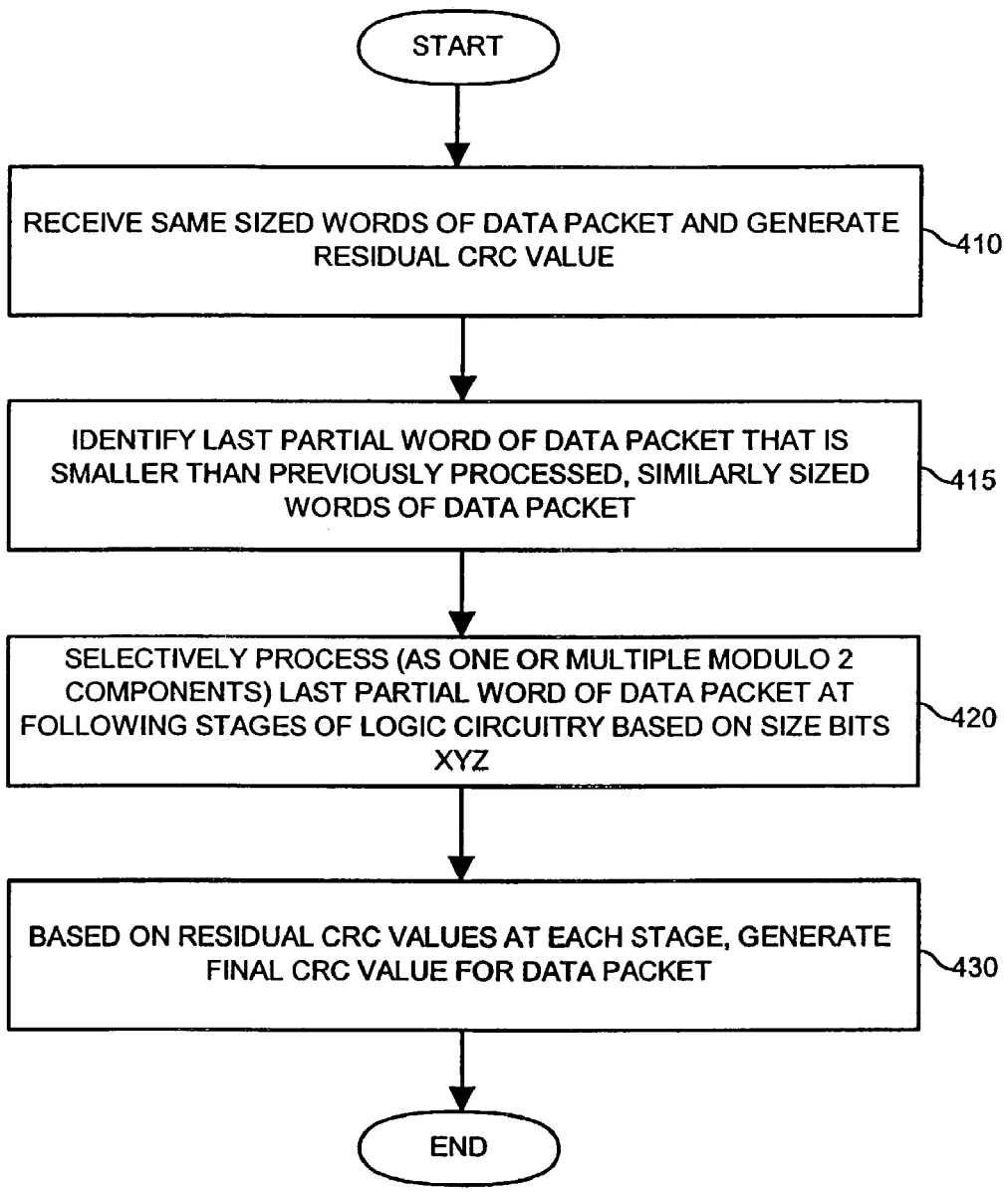
FIG. 5 is a flowchart illustrating a method of processing portions and sub-portions of data packets in a multi-stage logic circuit.

FIG. 5 is a flow chart illustrating a method of generating CRC value 120 using multi-stage logic circuit 140.

In step 410, stage 1 receives multiple similarly sized words 205 (such as first word 205-1, second word 205-2, . . . , seventh word 205-7) of data packet 110-1 and generates residual CRC value 235-1.

In step 415, word selector 215 identifies a last partial word 205-8 of data packet 110-1 for processing at successive stages (e.g., stages 2, 3 and 4) of multi-stage logic circuit 140.

In step 420, modulo-2 components A, B and C of last partial word 205-8 are processed at following stages of multi-stage logic circuit 140 based on size bits XYZ.

Finally, in step 430, multi-stage logic circuit 140 generates final CRC value 120-1 associated with data packet 110-1 based on residual CRC values 235.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An apparatus to support error-checking of data packets that vary in size, the apparatus comprising:
a memory device to store successive words of a given data packet; and
an electronic circuit to process the successive words of the given data packet stored in the memory device to produce an error-checking value associated with at least portions of the given data packet, the electronic circuit including:
a detection circuit that identifies a size associated with words of the given data packet; and
multiple stages of logic circuitry that each process different words of the given data packet depending on their size,
wherein similarly sized words of the given data packet are processed at one stage of the logic circuitry and a final partial word of the given data packet is further divided into modulo-2 components that are selectively processed at following stages of the logic circuitry.

2. An apparatus as in claim 1, wherein the electronic circuit maintains size bits associated with the final partial word of the given data packet, the size bits indicating a size of the associated partial word of the given data packet and which of the following stages of logic circuitry shall process corresponding modulo-2 components.

3. An apparatus as in claim 1, wherein the electronic circuit simultaneously processes a word of the given data packet at one stage of the logic circuitry and a word of another data packet at a second stage of the logic circuitry.

4. An apparatus as in claim 1, wherein the electronic circuit generates a CRC (Cyclical Redundancy Check) value for data packets transmitted over a communication network.

5. An apparatus as in claim 1, wherein the electronic circuit generates at least residual CRC (Cyclical Redundancy Check) values at two or more stages of the logic circuitry.

6. An apparatus as in claim 1, wherein successive stages of the logic circuitry process successively smaller modulo-2 components of the given data packet.

7. An apparatus as in claim 1 farther comprising:
a barrel shifter circuit to shift bits of the given data packet at successive stages of the logic circuit.

8. An apparatus as in claim 1, wherein the multiple stages of logic circuitry each include a pipelined set of registers, each set of registers storing multiple bytes of the given data packet for simultaneous processing.

9. A method to support error-checking of data packets that vary in length, the method comprising:
receiving successive words of a given data packet;
detecting sizes associated with successive words of the given data packet;

processing words of the given data packet at one of multiple stages of logic circuitry depending on a corresponding size of the word of the given data packet to be processed; and as a result of processing words of the given data packet, generating a result used in error-checking, wherein processing words of the given data packet includes:
processing multiple similarly sized words of the given data packet at one stage of the logic circuitry;
identifying a final partial word of the given data packet that is smaller than the similarly sized words of the given data packet; and
selectively processing modulo-2 components of the final partial word of the given data packet at following stages of logic circuitry.

10. A method as in claim 9, wherein selectively processing words of the given data packet includes:
maintaining size bits associated with words of the given data packet, the size bits indicating a size of a corresponding word of the given data packet; and
utilizing the size bits to process the modulo-2 components of the given data packet.

11. A method as in claim 9, wherein processing words of the given data packet at one of multiple stages of logic circuitry includes:
simultaneously processing a word of the given data packet at one stage of the logic circuitry and a word of another data packet at a second stage of the logic circuitry.

12. A method as in claim 9, wherein processing words of the given data packet includes:
generating a CRC (Cyclical Redundancy Check) value for data packets transmitted over a communication network.

13. A method as in claim 9, wherein processing successive words of the given data packet includes:
generating at least a residual CRC (Cyclical Redundancy Check) value at each of two or more stages of the logic circuitry.

14. A method as in claim 9, wherein processing words of the given data packet includes:
processing successively smaller modulo-2 components of the final partial word of the data packet at successive stages of logic circuitry.

15. A method as in claim 9 further comprising:
barrel-shifting bytes of the given data packet at successive stages of processing.

16. A method as in claim 15 farther comprising:
along with generating a final CRC (Cyclical Redundancy Check) value associated with the given data packet, reverse barrel-shifting bits associated with the given data packet processed at successive stages of logic circuitry.

17. An apparatus to support error-checking in data packets of varying length, the apparatus comprising:
a memory device to store successive words of a given data packet; and
means for processing the successive words of the given data packet stored in the memory device, the processing means including:
a detection circuit that identifies a size associated with words of the given data packet; and
multiple stages of logic circuitry, each of which processes different modulo-2 components of the given data packet depending on their size,
wherein similarly sized words of the given data packet are processed at one stage of the logic circuitry and a final partial word of the given data packet is further divided into modulo-2 components that are selectively processed at following stages of the logic circuitry.

18. A method as in claim 9, wherein receiving the successive words of the given data packet includes receiving multiple same sized portions of the given data packet; and
wherein processing words of the given data packet includes generating a first residual error-checking value associated with the same sized portions of the given data packet at a first stage of the logic circuitry.

19. A method as in claim 18 further comprising:
receiving a final portion of the given data packet at the first stage of the logic circuitry;
detecting that the final portion of the given data packet is smaller than the same sized portions previously processed in the first stage; and
generating a set of size bits associated with the final portion of the given data packet.

20. A method as in claim 19, wherein processing the words of the given data packet further includes:
from the first stage, receiving the final portion of the data packet and set of size bits at a second stage of the logic circuitry;
based on the received set of size bits, detecting whether an unprocessed portion of the final portion includes a respective first portion to be processed by the second stage and
i) if so, processing the respective first portion at the second stage to generate a second residual error-checking value based on a combination of the first residual error-checking value and the respective first portion processed at the second stage,
ii) if not, forwarding the final portion and the first residual error-checking value to a following stage of the logic circuitry for processing without processing the respective first portion at the second stage.

21. A method as in claim 20, wherein processing the words of the given data packet further includes:
from the second stage, receiving the final portion of the data packet and set of size bits at a third stage of the logic circuitry;
based on the received set of size bits, detecting whether a respective portion of the final portion not processed by the first stage and the second stage includes a respective second portion to be processed by the third stage and, if so, processing the respective second portion at the third stage to generate a third residual error-checking value based on a combination of the second residual error-checking value and the respective second portion processed at the third stage; and
the respective second portion of the given data packet being half a size of the respective first portion of the given data packet processed in the second stage.

22. A method as in claim 21 further comprising:
simultaneously processing the final portion of the given data packet at a stage of logic circuitry later than the first stage and a corresponding portion of another data packet at the first stage of the logic circuitry.

23. An apparatus as in claim 1, wherein the electronic circuit, when receiving the successive words of the given data packet, receives multiple same sized portions of the given data packet; and
wherein the electronic circuit processes the same sized portions of the given data packet to generate a first residual error-checking value associated with the same sized portions of the given data packet at a first stage of the logic circuitry.

24. An apparatus as in claim 23, wherein the electronic circuit receives a final portion of the given data packet at the first stage of the logic circuitry and detects that the final portion of the given data packet is smaller than the same sized portions previously processed in the first stage; and
wherein the electronic circuit generates a set of size bits associated with the final portion of the given data packet, the apparatus further comprising:
a second stage that receives the final portion of the data packet and set of size bits from the first stage;
the second stage detecting, based on the set of size bits, whether an unprocessed portion of the final portion includes a respective sub-portion to be processed by the second stage and
i) if so, the second stage processing the respective first portion at the second stage to generate a second residual error-checking value based on a combination of the first residual error-checking value and the respective sub-portion processed at the second stage,
ii) if not, the second stage forwarding the final portion and the first residual error-checking value to a following stage of the logic circuitry for processing without processing the respective sub-portion at the second stage.

25. An apparatus as in claim 24, wherein the electronic circuit simultaneously processes the final portion of the given data packet at a stage of logic circuitry later than the first stage and processes a corresponding portion of another data packet at the first stage of the logic circuitry.

26. Apparatus according to claim 1, wherein each of the multiple stages of logic circuitry includes:
a logic circuit operative to calculate an output residue value based on (1) a respective input modulo-2 portion of an input data word of the data packet, and (2) an input residue value previously calculated based on one or more other words of the data packet;
a residue register operative to store the output residue value from the logic circuit and to provide the stored residue value as the input residue value to a next successive stage of logic circuitry;
shifter circuitry operative in response to an input size value indicating a size of the partial final word of the given data packet to selectively shift the input data word to generate a respective output data word having a next modulo-2 portion in a predetermined position;
a size register operative to store the input size value and to provide the stored size value as the input size value to the next successive stage of logic circuitry; and
a register for receiving and storing the output data word and providing the stored data word as the input data word to a next successive stage of logic circuitry, such that the next modulo-2 portion from the predetermined position is provided as the input modulo-2 portion to the logic circuit of the next successive stage of logic circuitry.

27. A method according to claim 9, wherein selectively processing modulo-2 components of the final partial word of the given data packet at following stages of logic circuitry comprises:

in a respective logic circuit of each of the following stages of logic circuitry, calculating an output residue value based on (1) a respective input modulo-2 portion of an input data word of the data packet, and (2) an input residue value previously calculated based on one or more other words of the data packet;
in a respective residue register of each of the following stages of logic circuitry, storing the output residue value from the logic circuit and providing the stored residue value as the input residue value to a next successive stage of logic circuitry;
in shifter circuitry of each of the following stages of logic circuitry and in response to an input size value indicating a size of the partial final word of the given data packet, selectively shifting the input data word to generate a respective output data word having a next modulo-2 portion in a predetermined position;
in a size register of each of the following stages of logic circuitry, storing the input size value and providing the stored size value as the input size value to the next successive stage of logic circuitry; and
in a register of each of the following stages of logic circuitry, receiving and storing the output data word and providing the stored data word as the input data word to a next successive stage of logic circuitry, such that the next modulo-2 portion from the predetermined position is provided as the input modulo-2 portion to the logic circuit of the next successive stage of logic circuitry.

28. Apparatus according to claim 17, wherein each of the multiple stages of logic circuitry includes:
a logic circuit operative to calculate an output residue value based on (1) a respective input modulo-2 portion of an input data word of the data packet, and (2) an input residue value previously calculated based on one or more other words of the data packet;
a residue register operative to store the output residue value from the logic circuit and to provide the stored residue value as the input residue value to a next successive stage of logic circuitry;
shifter circuitry operative in response to an input size value indicating a size of the partial final word of the given data packet to selectively shift the input data word to generate a respective output data word having a next modulo-2 portion in a predetermined position;
a size register operative to store the input size value and to provide the stored size value as the input size value to the next successive stage of logic circuitry; and
a register for receiving and storing the output data word and providing the stored data word as the input data word to a next successive stage of logic circuitry, such that the next modulo-2 portion from the predetermined position is provided as the input modulo-2 portion to the logic circuit of the next successive stage of logic circuitry.

* * * * *